United States Patent
Meitinger

(10) Patent No.: US 10,195,958 B2
(45) Date of Patent: Feb. 5, 2019

(54) METHOD FOR COOLING A COMPONENT OF A MOTOR VEHICLE, COOLING DEVICE, AND MOTOR VEHICLE

(71) Applicant: AUDI AG, Ingolstadt (DE)

(72) Inventor: Karl-Heinz Meitinger, München (DE)

(73) Assignee: Audi AG, Ingolstadt (DE)

( * ) Notice: Subject to any disclaimer, the term of this patent is extended or adjusted under 35 U.S.C. 154(b) by 108 days.

(21) Appl. No.: 15/118,381

(22) PCT Filed: Jan. 28, 2015

(86) PCT No.: PCT/EP2015/000160
§ 371 (c)(1),
(2) Date: Aug. 11, 2016

(87) PCT Pub. No.: WO2015/120958
PCT Pub. Date: Aug. 20, 2015

(65) Prior Publication Data
US 2017/0174094 A1    Jun. 22, 2017

(30) Foreign Application Priority Data

Feb. 12, 2014  (DE) .................. 10 2014 001 974

(51) Int. Cl.
*H05K 7/20*      (2006.01)
*B60L 11/18*    (2006.01)
(Continued)

(52) U.S. Cl.
CPC ........... *B60L 11/1874* (2013.01); *B60L 1/003* (2013.01); *B60L 1/08* (2013.01); *H05K 7/20936* (2013.01);
(Continued)

(58) Field of Classification Search
None
See application file for complete search history.

(56) References Cited

U.S. PATENT DOCUMENTS

| 4,633,822 A | 1/1987 | Hayashi |
| 4,677,942 A | 7/1987 | Hayashi |

(Continued)

FOREIGN PATENT DOCUMENTS

| DE | 2107011 | 8/1972 |
| DE | 198 26 733 | 12/1999 |

(Continued)

OTHER PUBLICATIONS

Machine Translation of DE2009057163 published 2013.*
(Continued)

*Primary Examiner* — Wyatt P McConnell
(74) *Attorney, Agent, or Firm* — Henry M. Feiereisen LLC

(57) ABSTRACT

In a method for cooling a component of a motor vehicle, which component is coupled thermally to a cooling volume filled with a liquid coolant, at least one cooling parameter is measured by a control device and, in dependence on the cooling parameter, the component is either cooled in a first cooling mode, in which the cooling volume is connected via a first and second coupling device to a cooling circuit which includes at least one circulating device by means of which the coolant is circulated, or is cooled in a second cooling mode, in which the cooling volume is separated from the cooling circuit by the first and second coupling device, wherein the component is cooled by evaporation of coolant in the cooling volume.

18 Claims, 2 Drawing Sheets

(51) Int. Cl.
  *B60L 1/08* (2006.01)
  *B60L 1/00* (2006.01)
  *B60K 11/02* (2006.01)
  *B60K 1/00* (2006.01)
  *B60H 1/00* (2006.01)
  *F01P 3/00* (2006.01)
  *F01P 7/14* (2006.01)

(52) U.S. Cl.
  CPC ......... *H05K 7/20945* (2013.01); *B60H 1/00* (2013.01); *B60K 11/02* (2013.01); *B60K 2001/003* (2013.01); *B60L 2240/34* (2013.01); *B60L 2240/36* (2013.01); *B60L 2240/525* (2013.01); *B60L 2240/545* (2013.01); *B60L 2250/18* (2013.01); *F01P 3/00* (2013.01); *F01P 7/14* (2013.01); *H01L 2924/0002* (2013.01)

(56) References Cited

U.S. PATENT DOCUMENTS

| | | | |
|---|---|---|---|
| 8,371,593 B2 | 2/2013 | Michel et al. | |
| 8,490,983 B2 | 7/2013 | Schmid et al. | |
| 8,534,684 B2 | 9/2013 | Michel et al. | |
| 8,645,026 B2 | 2/2014 | Bä et al. | |
| 8,731,780 B2 | 5/2014 | Michel et al. | |
| 8,746,713 B2 | 6/2014 | Meitinger et al. | |
| 8,801,107 B2 | 8/2014 | Schmid et al. | |
| 8,831,859 B2 | 9/2014 | Meitinger et al. | |
| 8,894,077 B2 | 11/2014 | Michel et al. | |
| 8,955,345 B2 | 2/2015 | Meitinger et al. | |
| 9,162,582 B2 | 10/2015 | Meitinger et al. | |
| 9,193,381 B2 | 11/2015 | Bär et al. | |
| 9,239,084 B2 | 1/2016 | Meitinger | |
| 9,387,852 B2 | 7/2016 | Meitinger et al. | |
| 2002/0124997 A1 | 9/2002 | Blome | |
| 2004/0250995 A1 | 12/2004 | Morishita et al. | |
| 2008/0093139 A1 | 4/2008 | Dobereiner et al. | |
| 2012/0306173 A1 | 12/2012 | Meitinger et al. | |
| 2013/0131920 A1 | 5/2013 | Meitinger et al. | |
| 2013/0175776 A1 | 7/2013 | Michel et al. | |

FOREIGN PATENT DOCUMENTS

| | | |
|---|---|---|
| DE | 10 2004 035 879 | 2/2006 |
| DE | 10 2009 057 163 | 6/2011 |
| DE | 10 2011 107 540 | 1/2013 |
| EP | 1 264 715 | 4/2006 |
| WO | WO 2012/131459 | 10/2012 |

OTHER PUBLICATIONS

Chinese Search Report issued by the Chinese Patent Office in Chinese Application No. 2015800081285 dated May 2, 2017.
English translation of Chinese Search Report issued by the Chinese Patent Office in Chinese Application No. 2015800081285 dated May 2, 2017.
International Search Report issued by the European Patent Office in International Application PCT/EP2015/000160.
Wilfried Michel et al., U.S. Pat. No. 8,322,729, Dec. 4, 2012, 2012-0126498, May 24, 2012.

* cited by examiner

METHOD FOR COOLING A COMPONENT OF A MOTOR VEHICLE, COOLING DEVICE, AND MOTOR VEHICLE

CROSS-REFERENCES TO RELATED APPLICATIONS

This application is the U.S. National Stage of International Application No. PCT/EP2015/000160, filed Jan. 28, 2015, which designated the United States and has been published as International Publication No. WO 2015/120958 and which claims the priority of German Patent Application, Ser. No. 10 2014 001 974.8, filed Feb. 12, 2014, pursuant to 35 U.S.C. 119(a)-(d).

BACKGROUND OF THE INVENTION

The invention relates to a method for cooling a component of a motor vehicle, which is thermally coupled with a cooling volume filled with a liquid coolant.

In motor vehicles many components require cooling. The increased used of high-power electronics in motor vehicles, in particular for driving an electric or hybrid vehicle, increasingly requires the cooling of power electronics components. In addition pure electric drives or hybrid drives are currently also used in high-power motor vehicles, which requires supply of current to and control of high-power electric motors in the motor vehicle. When the motor is operated at full load, very high currents flow through numerous components of the power electronics, in particular voltage converters, but also through various open loop or closed loop control elements and/or very high voltages are present at these components, which even in the case of efficient components produces a large amount of waste heat that has to be dissipated. A cooling system for these components therefore has to be configured so as to ensure sufficient cooling also in the case when a maximal power is converted at the component. The same applies to mechanical components, in particular components of the motor in which significantly different thermal loads can occur during driving.

In order to always ensure sufficient cooling, the cooling of the component has to be configured so that a sufficient cooling of the component is available at maximal load. In order to meet this requirement in particular the power electronics for operating high-power electric drives require large-dimensioned cooling systems. In these cooling systems multiple or very high-power pumps are used in order to pump coolant with high flow velocity through regions in which a heat exchange with components that have to be cooled occurs. Hereby the cooling power maximally provided by these cooling systems is rarely used in typical driving situations of the motor vehicle. During operation of a motor vehicle in normal street traffic, most drivers do not use the maximal power of the motor vehicle. Even when this maximal power is used it is typically used in selected situations for a few seconds such as overtaking or accelerating. Even in the case of a sporty driving, in particular on closed racetracks or the like, the full power is not always used by motor vehicle components. As a result in most driving situations the available cooling power is much greater than actually necessary independent of the type of the driving.

This cooling power unnecessarily exceeds that required for most driving situations and as a result the cooling system of a motor vehicle subjects the electric onboard system of a motor vehicle to unnecessary stress and can thus lead to reduced power and in particular to a reduced range of an electrically driven motor vehicle. A possible approach to adjust the cooling power of such a cooling system would be to lower the pump power of the one or multiple pumps in the cooling circuit of the cooling device in situations that only require a low cooling power. This however involves the problem that high-power cooling devices in motor vehicles are typically constructed so as to only reach a maximal efficiency when coolant is pumped through the cooling system with high velocity for example in order to enable turbulent flows in the regions in which a heat exchange with the component occurs. A high heat transfer is hereby in particular required because power components to be cooled oftentimes have a relatively small surface area and a low thermal inertia so that a high heat transfer oftentimes can only be achieved by turbulent and/or fast flowing coolant. In this case a reduction of the cooling power would lead to a slower flowing coolant and with this to a lower efficiency of the cooling device. In case of a low load this would result in a relative inefficient and with this energy-intensive cooling of the component.

SUMMARY OF THE INVENTION

The invention is therefore based on the object to present a method for cooling a component of a motor vehicle, which has a broad range of power demands, i.e., which is improved at low as well as high amounts of heat to be dissipated, and in particular with regard to energy efficiency.

The object is solved according to the invention by a method of the aforementioned type, wherein by a control device at least one cooling parameter is detected and in dependence on the cooling parameter the component is either cooled in a first cooling mode in which the cooling volume is connected with a cooling circuit via a first and a second coupling device, which cooling circuit includes at least one circulation device by which coolant is circulated, or cooled in a second cooling mode in which the cooling volume is separated from the cooling circuit by the first and second coupling device, wherein the component is cooled by evaporation of the coolant in the cooling volume.

The inventive method is based on the idea that two different cooling modes are used for cooling the component depending on a cooling parameter, wherein an automatic change of the cooling mode in dependence on the cooling parameter is provided. In the first cooling mode the coolant is circulated for cooling. This cooling mode corresponds to the mode mentioned above in which liquid coolant is pumped through a cooling volume, in particular with high velocity, which cooling volume thermally contacts the component to be cooled. In a second cooling mode on the other hand a method is used in which the coolant is not circulated by a circulation device but the circulation is accomplished by the fact that the coolant evaporates in hot regions, i.e., on the component itself or in a region of the cooling volume that is thermally coupled with the component. Hereby energy is taken up by the coolant on one hand due to the temperature change of the coolant and on the other hand due to the evaporation of the coolant. This evaporation generates an over-pressure in the region in which the coolant is evaporated, which causes vapor bubbles of the coolant to enter the volume of the coolant where they give off the absorbed heat to the remaining portion of the coolant or the walls of the cooling volume. The evaporation of the coolant thus achieves a heat transport by convection in the coolant itself. The heat introduced by the component into the cooling volume and with this into the liquid coolant is thus distributed very quickly in the entire cooling volume. This distribution of heat increases the effective surface area available for heat exchange with the environment. As a result, sufficient cooling of the component can be ensured in many cases solely due to convection in the cooling volume a.

In the simplest case the cooling parameter can be a temperature value detected by a temperature sensor arranged on the component or in the region of the component. In this case cooling can be performed in the second cooling mode when small temperature values are detected, which enables cooling of the component with no or only small energy consumption. When higher temperature values are detected this means that the component has to be cooled more strongly. In this case the component can be cooled in the first cooling mode by circulating coolant in a cooling circuit. Hereby cold coolant flows through the cooling volume, in particular turbulently, which achieves a great heat transport from the component into the cooling circuit and from there in particular to a heat exchanger. The cooling mode can thus be changed automatically in dependence on a temperature of a component.

As mentioned in particular power components oftentimes have a smaller thermal inertia, and therefore temperature changes can occur at these components very rapidly. It may therefore also be advantageous in the method according to the invention to detect further parameters in addition to or instead of the temperature values that are taken into account for determining the cooling parameter. For example a motor control may correspondingly adjust a cooling parameter already simultaneous with or shortly after a request of a high power by the motor so that a change into the second cooling mode occurs.

An automatic change between the cooling modes is also possible in dependence on a broad range of different cooling parameters. Hereby in particular an immediate change of the cooling mode can occur as soon as the cooling parameter exceeds or falls below a threshold value, however, it is also possible that the change only occurs with a time delay and/or that the cooling mode is only changed when a threshold value was exceeded or fallen below for a predetermined period of time. The time interval can hereby in particular depend on the extent to which the threshold value has been exceeded or fallen below.

The component can be an electrical component, wherein an actual electrical operating parameter of the component or a circuit of which the component is a part or a target value for the operating parameter set by the control device is detected as cooling parameter. The operating parameter can hereby in particular be an actual performance, an actual current or an actual voltage. As an alternative the operating parameter can be a set point performance, a set point current or a set point voltage. This achieves as mentioned above that the cooling is not only adjusted retroactively when due to a prior change of the electric load of the component the temperature of the component rises or falls, but rather the cooling power can be adjusted already at the occurrence or even prior to the occurrence of the cause, i.e., the change of the load of the component.

Detecting actual electrical operating parameters and/or set point values for these operating parameters allows further optimizing the cooling method. When it is for example known that at an actual power value flowing through the component sufficient cooling of the component is possible for example for 5 seconds, the second cooling mode can for example first be maintained for 3 or 4 seconds when detecting this power value and only when the detected power value has not fallen after this time period again switching into the first cooling mode occurs. Such a delayed switching between the cooling modes allows on one hand to further lower the energy consumption of the cooling system, i.e., the method according to the invention makes the motor vehicle more efficient which increases the range of the motor vehicle. On the other hand such a configuration of the method according to the invention also increases the efficiency of the motor vehicle overall. When the electric component is for example a part of the power electronics of a motor vehicle, operation of the at least one circulation device in the first cooling mode together with the operation of an electric drive may expose the onboard network to such a load that lowers the operating voltage in the onboard network. Operation of the circulation device thus reduces the power available for the electric drive. When as described above enabling a high power output for a short period of time without changing into the first cooling mode enables a maximal power output in this time interval because the electric power of the onboard network does not have to be divided between the at least one circulation device and the electric drive.

As an alternative or in addition to the described detection of a set point or actual value of an electrical operating parameter also the temperature of the component or further parts of the motor vehicle or the operating mode of the motor vehicle can be analyzed. Hereby for example a weighted sum can be formed from a set point power and the temperature, wherein the operating mode of the motor vehicle sets weighting factors. Operating modes of the motor vehicle may in particular include different vehicle settings such as a comfort mode or a sporty mode, or an engaged gear or the like. Beside the use of weighted sums it is also possible to separately analyze individual operating parameters and to compare these in particular with threshold values, wherein comparison results can be logically clinked in order to determine the cooling parameter and with this the cooling mode. This for example achieves that the cooling mode, so long as the measured temperature is below a threshold value, is determined by a predetermined set point power, when exceeding a predetermined temperature threshold value however it is always changed into the first cooling mode.

The operating parameter can in particular be the current strength of a current through the component or a predetermined part of the circuit or a voltage, which drops at the component or between two predetermined points in the circuit or an electrical power received or outputted by the circuit. Hereby it is possible to analyze the actual value of the mentioned variable, however, also set point values can be detected or the operating parameters can be pre-processed in order to analyze a statistic over a predetermined time interval. Beside direct voltages, direct currents and direct current powers, also alternating voltages, alternating currents and alternating powers can be measured. In the case of alternating voltages or alternating currents as operating parameters, in particular maximal voltages or maximal currents or the RMS-values of the voltages or currents can be analyzed. In the analysis of an alternating current power the active and/or reactive power can be detected and analyzed.

A dynamic control of the cooling mode can in particular be achieved when the cooling parameter is continuously detected and when the cooling parameter exceeds a first predetermined threshold value or falls below the first or a second predetermined threshold value, the control device changes the cooling mode. The ongoing detection of the cooling parameter can hereby occur periodically, however, it is also possible to perform the detection continuously in particular by an analog control device. The first and/or second threshold value can hereby be dynamically adjusted. In particular the first and/or the second threshold value can depend on an operating mode of the motor vehicle.

When a second threshold value is used that differs from the first threshold value the switching between the first and the second cooling mode is hysteretic regarding the cooling parameter. This is advantageous because during switching between the two cooling modes on one hand a certain minimal amount of time is required and on the other hand potentially the energy consumption of the motor vehicle is briefly increased. A hysteretic switching between the two operating modes avoids a constant back and forth switching in the threshold range.

In the second cooling mode the component is cooled by evaporation of coolant. As explained above the method according to the invention is advantageous in particular when using power electronics components. Power electronics components are oftentimes semiconductor components, which for example still reliably function at operating temperatures of 70 to 90° C., but above a certain temperature, for example 100° C., may be damaged or no longer reliably perform the function of a circuit. Usually water is used as a coolant in motor vehicles, which at normal pressure has a boiling point of 100° C. Oftentimes additives are added to the water that are anticorrosive and/or prevent freezing of the water at low temperatures. For this purpose for example heat carrier liquids on the basis of monoethylene glycol can be used. Such liquids themselves have a boiling point in the range of above 150° C. Mixtures of water and such heat conducting liquids typically have boiling points in the range of just above 100° C. at standard pressure. Therefore cooling the component in the second cooling mode by a coolant at standard pressure requires using power electronics components that are functional at high temperatures or using other coolants that have a lower boiling point.

Therefore it is proposed to reduce the pressure in the cooling volume when switching from the first cooling mode into the second cooling mode. This allows circulating the coolant at standard pressure, which obviates modifying the cooling circuit including the optional heat exchanger and the circulation direction. A pressure reduction thus occurs exclusively in the second cooling mode in which the cooling volume is separated from the cooling circuit. As a result the pressure of the coolant only has to be controlled in the cooling volume. The pressure in the cooling volume can for example be reduced by pumping. For this purpose the cooling volume can for example first be separated from the cooling circuit and subsequently an additional pump can pump coolant out of the cooling volume. Because no further coolant can flow back into the cooling volume this reduces the pressure in the cooling volume. As an alternative the cooling volume may also be increased after closing the cooling volume for example by withdrawing a piston in order to increase the volume or the like.

Particularly preferably, however, the circulation device, which is present in the cooling circuit anyway, can be used to lower the pressure. This can be accomplished for example in that the first coupling device is arranged upstream of the cooling volume in flow direction of the coolant in the first cooling mode and the second coupling device downstream of the cooling volume, wherein when changing from the first cooling mode into the second cooling mode the first coupling device is first separated, and subsequent thereto, only after passage of a predetermined period of time and/or when a predetermined separation condition is satisfied, the second coupling device is separated. The separation of the first coupling device causes the cooling volume to be closed on one side and prevents further coolant from flowing into the cooling volume through the first coupling device. At the same time, because the outlet of the cooling volume remains connected with the cooling circuit, coolant is pumped out of the cooling volume by the circulation device. As a result a negative pressure is generated in the cooling volume. Depending on the specification of the circulation device, in particular a pump, and in particular depending on the pressure differential the circulation device is able to create relatively strong negative pressures in the cooling volume. Thus it is possible for example to lower the pressure from 1 bar to 0.2 bar or less. After a predetermined period of time or when a predetermined condition is satisfied the second coupling device can be separated which generates a closed volume in the cooling volume which is filled with a coolant at low pressure.

The separation condition can be that the pressure in the cooling volume falls below a predetermined first pressure value. This separation condition ensures that a pressure is established in the cooling volume that is at or below the predetermined pressure value. This also ensures that the boiling temperature of the coolant is the same or smaller than a temperature value assigned to the predetermined pressure value. For detecting the pressure a pressure-measuring device can be provided in the cooling volume. As an alternative pressure values can also be detected in other parts of the cooling device, for example in a compensation container of the cooling circuit or in the pipe system of the cooling device by a pressure-measuring device arranged at the respective sites and can then be analyzed according to the separation condition. As an alternative or in addition it is for example also possible to detect the power uptake, a rotational speed or other parameters of the circulation device, which allows drawing conclusion regarding the pressure gradient at the circulation device and to use this parameter for analyzing the separation condition.

In order to enable a most effective cooling of the component and a fastest possible switching from the second cooling mode into the first cooling mode it is advantageous when the flow buildup for the cooling by circulation of the coolant is already supported by re-connecting the cooling volume to the cooling circuit. For this purpose it is possible that in the first cooling mode the first coupling device is arranged in flow direction of the coolant upstream of the cooling volume and the second coupling device downstream of the cooling volume, wherein when switching from the second cooling mode into the first cooling mode the first coupling device is first connected, and subsequent thereto only after a passage of a predetermined period of time and/or when a predetermined connection condition is satisfied the second coupling device is connected. This is in particular advantageous when in the second cooling mode the pressure in the cooling volume is below the pressure in the remaining cooling circuit. In this case the coolant already starts to flow into the cooling volume upon connecting the first coupling device, so as to compensate the pressure differential between the cooling volume and the remaining cooling circuit. As a result a flow is already established in the direction that is used for cooling in the first cooling mode. After a predetermined period of time or when a predetermined connection condition is satisfied it is then assumed that the pressure difference is substantially compensated. Subsequent thereto the second coupling device is connected. Due to the inertia of the liquid flow, coolant now continues to flow through the first coupling device into the cooling volume and flows out of the cooling volume via the second coupling device into the cooling circuit again. Subsequent thereto the circulation device can be activated, wherein the starting up of the circulation device can be accomplished in a particularly energy efficient manner because an initial movement of the cooling liquid is already established. Depending on the concrete construction of the cooling circuit it may also be advantageous to activate the circulation device simultaneous with the connecting of the second coupling device or between the connecting of the first coupling device and the connecting of the second coupling device.

The connection condition can in particular be the exceeding of a predetermined second pressure value in the cooling volume. As described above, the pressure in the cooling volume is hereby detected by a pressure-measuring device, in particular a pressure sensor arranged in the cooling volume. However, the pressure can also be detected at other sites of the cooling circuit or operating parameters of the circulation device, for example a rotational speed, can be analyzed. Hereby a rotational speed may already be detected prior to activation of the circulation device because the already built up flow may move the non-driven circulation device.

As explained above, in the second cooling mode cooling of the component is accomplished by evaporation of the coolant. In most coolants evaporation of the coolant is associated with a significant expansion of the volume of the evaporated coolant. In the absence of counter measures this volume expansion of the evaporated coolant leads to compression of the remaining coolant, which causes an increase of the pressure in the cooling volume. This increase of pressure in turn increases the boiling temperature of the coolant. As described above this requires using a coolant with a low boiling point or using a component with a higher temperature resistance. However, in the case of a sufficiently large cooling volume only a very small portion of the total amount of coolant of the cooling volume evaporates so that the increase of the volume and with this the pressure increase is relatively small.

However in order to further reduce such a pressure increase or to prevent such a pressure increase to the most degree it is necessary to use a volume compensation device connected with the cooling volume, which enables an expansion and/or reduction of the cooling volume against a predetermined force. In this context the being connected with the cooling volume means that a free exchange of cooling liquid between the cooling volume and the volume compensation device is possible, wherein the volume compensation device may be connected with the cooling volume in particular by pipes or the like, or may be directly arranged on a wall of the cooling volume. The volume compensation device can be implemented by a piston, which can be moved by the coolant against a predetermined force in order to increase the cooling volume. Hereby the piston can in particular be supported by a spring or another elastic element. It is also possible however to use counterweights or the like in order to position-independently exert a constant force on the piston. As an alternative the volume compensation device can also be implemented in that at least one section of the cooling volume is made of an elastic material, in particular a rubber elastic material.

The first cooling mode is intended to provide a fastest possible heat transport away from the component. Therefore it is advantageous when a greatest possible amount of the coolant conducted through the cooling volume comes into direct contact with the component or with a region of the cooling volume that is strongly thermally coupled with the component. This can in particular be achieved in that the coolant is conducted turbulent through the cooling volume in the first cooling mode. In this case the coolant is swirled so that a constant exchange of coolant between a border region, which is in contact with the component or the region of the wall, which is well thermally coupled, and the rest of the volume flow.

The invention also relates to a cooling device for cooling a component of a motor vehicle, which is thermally coupled with a cooling volume of the cooling device that is filled with a coolant, wherein the cooling device is configured for performing the described embodiments of the method according to the invention. The first and the second coupling devices of the cooling device can be valves, which are in particular controlled by the control device. The circulation device can be configured as a pump. The control device can in particular be configured to deactivate the circulation device in the second cooling mode. In particular a current supply to a pump can be interrupted. As explained above it can also be provided that a volume compensation device is arranged in or at the cooling volume.

As explained with regard to the method, the circulation device may be used to generate a negative pressure in the cooling volume. In the absence of further measures implemented in the cooling device, this pumping leads to an as a result of the additional coolant being pumped in this region. Liquid coolants, in particular water, oftentimes have a lower compressibility, which means that already pumping a relative small amount of coolant into a fixed volume leads to a relatively strong change in pressure. In order to prevent this circumstance from limiting the pressure reduction in the cooling volume a compensation container for coolant can be arranged in the cooling circuit.

Such a compensation container can be implemented by a volume that is partially filled with coolant and partially with a gas, in particular air. The compensation container may be configured so that at least one part of its surface gas can exit from and enter into the compensation container, wherein in particular at the same site coolant can neither enter nor exit the compensation container. When additional coolant is now pumped into the compensation container the gas is pushed out of the compensation container. When coolant is removed from the compensation container the newly available volume is filled with gas. As an alternative it is also possible to use a gas tight compensation container. This is in particular possible because gases typically have a higher compressibility than liquids. When the pressure increases it would be predominantly the gas that is compressed. As an alternative to a compensation container the pressure compensation may also be implemented by a piston or an elastic wall as already described above with regard to the volume compensation device.

In the cooling volume and/or cooling circuit at least one pressure-measuring device for detecting the pressure of the coolant can be arranged. The pressure-measuring device can provide pressure measurement values to the control device. The measurement values of the pressure-measuring device can hereby in particular be taken into account in the analysis of the coupling condition and/or the separation condition.

The invention also relates to a motor vehicle, including at least one component to be cooled, wherein the motor vehicle includes a cooling device according to the invention according to one of the above described embodiments, wherein the component is thermally coupled with a cooling volume of the cooling device that is filled with a liquid coolant.

The component can in particular be a power electronics component of an electric drive of the motor vehicle. As described above in particular power electronics components of the drive are components which depending on the operating state of the motor vehicle may be subject to different stress levels. It is hereby advantageous to provide different cooling modes for these components.

The control device of the motor vehicle according to the invention can be configured for limiting the power of the drive to a maximal value which is smaller than a power value with which the drive is operable in the first cooling mode, when cooling is performed in the second cooling mode. Correspondingly it is also possible to limit a current and/or a voltage. Such a power limitation can in particular be desired when a particularly efficient operation of the motor vehicle is the goal. As explained above in particular in high-power motor vehicles the operation of a cooling device may contribute significantly to the energy consumption of the motor vehicle. When driving in a calm traffic situation and/or in city traffic, however, these power reserves may be withheld to enable a more efficient driving. In particular such a limitation of the power of the drive is also advantageous to enable access to more power only when the switching from the second into the first cooling mode has occurred completely. Thus it is for example possible that the circulation devices of the cooling device require a certain time interval for starting up. In order to prevent a strong heating up of the component the power can in this case be further limited to a maximal power value.

The control device can be configured to detect a set point power, which can be predetermined by a vehicle device, in particular an operating element that can be operated by the driver or a driver assist system, and when detecting a set point power that is greater than the maximal power value to switch into the first cooling mode. With this in particular the power can be limited to the maximal power value during an operating mode and in the case a driver or a driver assist system requests a higher power than the maximal power value it can first be switched into the first cooling mode and after switching into the first cooling mode the desired power can be made available.

In particular in high-power vehicles oftentimes a function is provided that lets a user select a desired operating mode, for example comfort, sporty, off-road or the like, wherein when switching the vehicle mode numerous vehicle parameters are adjusted. Correspondingly the motor vehicle according to the invention can have an input device for detecting a user input for selecting a vehicle mode and a control device, which serves for determining the cooling parameter and/or the first and/or the second threshold value for the cooling parameter and/or the maximal power value in dependence on the vehicle mode. Thus it is for example possible that a particularly economical vehicle mode is provided in the motor vehicle in which the cooling generally occurs in the second cooling mode, wherein the power is limited to a maximal power value in order to prevent damage to the component due to overheating. On the other hand a particularly sporty vehicle mode can be provided in which the cooling always occurs in the first cooling mode so that the full power of the motor vehicle is always available without delay. It is also possible that in a further sporty vehicle mode the first and second threshold value for the cooling parameter are selected so that switching into the second cooling mode only occurs in case of very minor loads on the component, wherein in case of a load on the component which does not yet require cooling per se in the first cooling mode switching into the first cooling mode already occurs early in order to provide higher powers without delay. The mentioned vehicle modes only serve as examples and many other vehicle modes are conceivable by a person with skill in the art.

In the motor vehicle of course multiple components can be cooled, wherein individual ones or multiple of these components may be arranged respectively in a separate cooling volume. Hereby first components can be located in a first cooling volume and second components in a second cooling volume, wherein each of these volumes has first and second coupling devices and each of the cooling volumes can be separately decoupled from a common cooling circuit. In this case it is possible to cool of the first cooling volume in the first cooling mode and the second cooling volume in the second cooling mode or vice versa when a respective bypass is provided for the cooling or when the coolant flows through the cooling volumes in parallel.

BRIEF DESCRIPTION OF THE DRAWING

Further advantages and details of the invention will become more apparent from the following exemplary embodiments and the associated drawings. It is shown in FIG. 1 a schematic representation of a cooling device according to the invention, FIG. 2 a schematic representation of a motor vehicle according to the invention, and FIG. 3 a schematic flow chart of a method according to the invention.

DETAILED DESCRIPTION OF PREFERRED EMBODIMENTS

Figure 1:
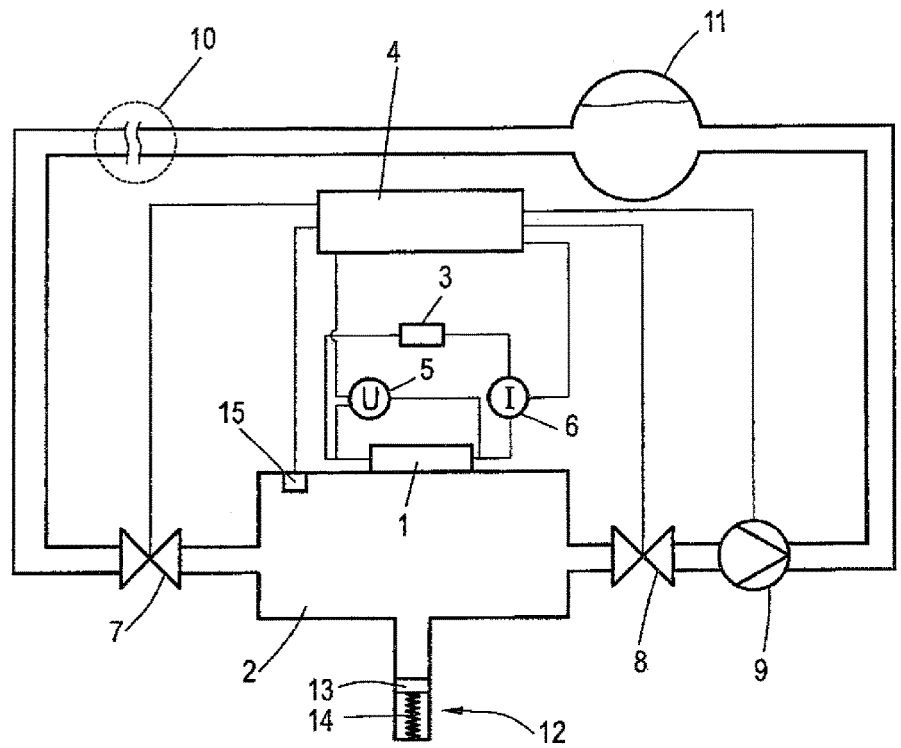

FIG. 1 schematically shows a cooling device for cooling a component 1 of a motor vehicle, which is thermally coupled with a cooling volume 2, which is filled with a coolant. The component 1 is a voltage converter, which together with a further component 3 forms a drive system of the motor vehicle. Hereby the cooling device includes a control device 4 for controlling the coupling devices 7, 8 and the circulation device 9. Depending on a power flowing through the component 1 the component 1 is cooled in a first cooling mode when a high power flows through the component, wherein in the first cooling mode the cooling volume 2 is connected with a cooling circuit via a first coupling device 7 and a second coupling device 8, which are both configured as valves, wherein the cooling circuit includes at least one circulation device 9 by which the coolant is circulated. When a low power flows through the component 1, the component 1 is cooled in a second cooling mode in which the cooling volume 2 is separated from the cooling circuit by the first coupling device 7 and the second coupling device 8. For this purpose the valves, which form the first and second coupling device 7, 8, are controllable by the control device 4.

For determining the power flowing through the component 1 the cooling device has a voltage-measuring device 5, which is connected in parallel to the component 1, and a current-measuring device 6, which is connected in series with the component 1. The voltage-measuring device 5 and the current-measuring device 4 are analyzed by the control device 4, and a power which flows through the component 1 is calculated in the control device 4 by multiplying the measurement values. In addition a not shown temperature sensor is arranged on the component 1, which is also analyzed by the control device 4. The control device 4 is hereby configured to control the valves which form the first and second coupling device 7, 8 and the circulation device 9 in order to switch from the first cooling mode into the second cooling mode and vice versa. The control device is configured to initiate a change into the first cooling mode when the temperature measurement value of the not shown temperature sensor exceeds a predetermined temperature threshold or the power flowing through the component 1 exceeds a first threshold value. The temperature measurement hereby serves as a fall back which ensures that when exceeding a predetermined temperature threshold value it is always switched into the first operating mode. When the temperature measurement value falls below the temperature threshold value and the power transported through the component 1 is lower than a second threshold value, the control device 4 is configured to switch into the second cooling mode.

The cooling device is first operated in the first cooling mode, i.e., cooling liquid can enter through the first coupling device 7 into the cooling volume 2 and exit out of the cooling volume 2 thorough the second coupling device 8. The coolant is hereby circulated by the circulation device 9. In the remaining cooling circuit additionally components 10 are arranged, in particular a heat exchanger and a compensation container 11. The compensation container 11 is formed by a volume that is only partially filled with cooling liquid. The compensation container 11 is also configured to permit gas exchange with the environment, i.e., so that gas, but not liquid, can escape from the compensation container and can enter the compensation container.

For changing into the second cooling mode first the coupling device 7 is controlled in order to separate the cooling volume 2 from the cooling circuit at the entry site. Because the circulation device 9 continues to be operated during this process, coolant is transported out of the cooling volume 2 and no additional coolant can flow back in. As a result a negative pressure is generated. At the same time this negative pressure reduces the cooling volume via the volume compensation device 12. The volume compensation device 12 is configured as a cylinder with a shiftable plate 13, which is sealed against the coolant and which is supported by a spring 14. When the pressure decreases in the cooling volume 2 the plate 13 is pulled in the direction of the cooling volume. Because the force exerted by the spring 14 is proportional to the deflection of the plate 13 and the force acting on the plate 13 as a result of the negative pressure in the cooling volume is proportional to the pressure differential between the cooling volume 2 and the environment, the deflection of the plate 13 is also proportional to the negative pressure between the cooling volume 2 and the environment.

The coolant withdrawn from the cooling volume 2 is hereby conducted into the compensation container 11. While the coolant is pumped out of the cooling volume 2 for lowering the pressure in the cooling volume 2 the pressure in the cooling volume 2 is constantly detected by the pressure sensor 15 arranged in the cooling volume 2. The control device 4 compares the pressure values of the pressure sensor 15 with a first pressure threshold value. When the pressure values fall below the first pressure threshold value the control device 4 controls the coupling device 8 in order to decouple the cooling volume 2 on the outflow side from the cooling circuit. With this the cooling volume 2 is completely decoupled from the cooling circuit. Subsequently the circulation device 9 can be deactivated by the control device 4. As a result no energy is consumed by the circulation device 9 in the second cooling mode.

Cooling of the component 1 in the second cooling mode is accomplished by evaporation of the coolant in the region of the cooling volume 2 adjoining the component 1. Herby gas bubbles are generated that displace coolant in the cooling volume 2 and with this temporarily increase the pressure in the cooling volume 2. This pressure increase, however, can be compensated by the volume compensation device 12. As a result of the evaporation of the liquid coolant in the regions of the cooling volume 2 adjacent the component 1 an overpressure is generated in this region and the heated or evaporated coolant is displaced from this region. As a result a convection movement is generated in the cooling volume 2, which cools the component 1. This convection of the coolant results in a very good heat conduction within the cooling volume 2. As a result the surface of the component 1 via which heat can be given off is thus enlarged to the total surface of the cooling volume 2.

When the control device 4 now determines that a change into the first cooling mode is to be effected, the control device 4 first controls the coupling device 7 in order to couple the cooling volume 2 with the cooling circuit on the inflow site. Because a higher pressure prevails in the cooling circuit than in the cooling volume 2, coolant flows from the cooling circuit into the cooling volume 2. As a result the pressure decreases in the compensation container 11, the volume compensation device 12 moves in the direction of its original position and the pressure in the cooling volume 2 increases. During this pressure increase pressure values are constantly detected by the pressure-measuring device 15. When the detected pressure values exceed a pressure threshold value predetermined in the control device 4 the control device 4 controls the coupling device 8 to couple the cooling volume 2 with the cooling circuit at the outflow side. Because the coupling of the cooling volume 2 on the inflow side with the cooling circuit already initiated a flow, this flow now further flows from the cooling volume 2 though the coupling device 8 in the direction of the circulation device 9. This already achieves a coolant flow at the circulation device 9. As a result the control device 4 can now start the circulation device 4 and less time and energy is required for starting the circulation device 9 because a coolant flow is already established.

Figure 2:
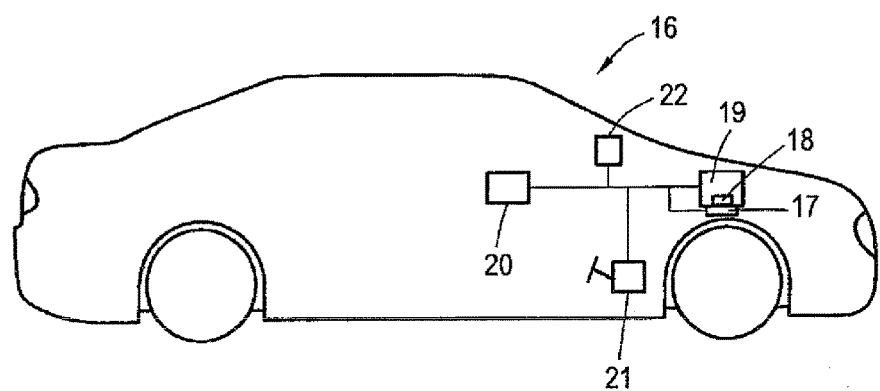

FIG. 2 schematically shows a motor vehicle 16 with a cooling device 17 for cooling a component 18 of the motor vehicle 16. The component 18 is a part of the power electronics of the drive 19 of the motor vehicle. The construction of the cooling device 17 substantially corresponds to the construction of the cooling device shown in FIG. 1, wherein no measurement of the power that flows through the component 1 is provided.

For controlling the drive 19 and the cooling device 17 and further not shown components of the motor vehicle 16, the motor vehicle 16 includes a control device 20. The control device is connected with the components of the drive 19, the cooling device 17 and an operating element 21 operable by the driver and an input device 22 via a Bus, for example a CAN Bus. In the motor vehicle 16 the operating element 21 is constructed as a gas pedal. For controlling the drive power the position of the operating element 21 and further vehicle data are detected by not further shown sensors and data of the drive 19 are detected by the control device 20, and the drive 19 is controlled based on these data. With this a drive-by-wire-system is formed in the motor vehicle 16 at least with regard to the motor control, wherein the shown principles can of course also be applied to conventional motor controls. The drive 19 and the cooling device 17 for the component 18 are additionally controlled based on user inputs on the input device 22. The input device 22 allows selecting different vehicle modes, which for example enable a particularly sporty, a particularly energy-efficient or a particularly comfortable driving.

The control device 20 is hereby configured to control the drive 19 and the cooling device 17 in dependence on a set point power, which is determined in dependence on the detected position of the operating element 21 and optional the drive mode. The control of the cooling device and the motors is hereby accomplished as explained below with reference to FIG. 3.

Figure 3:
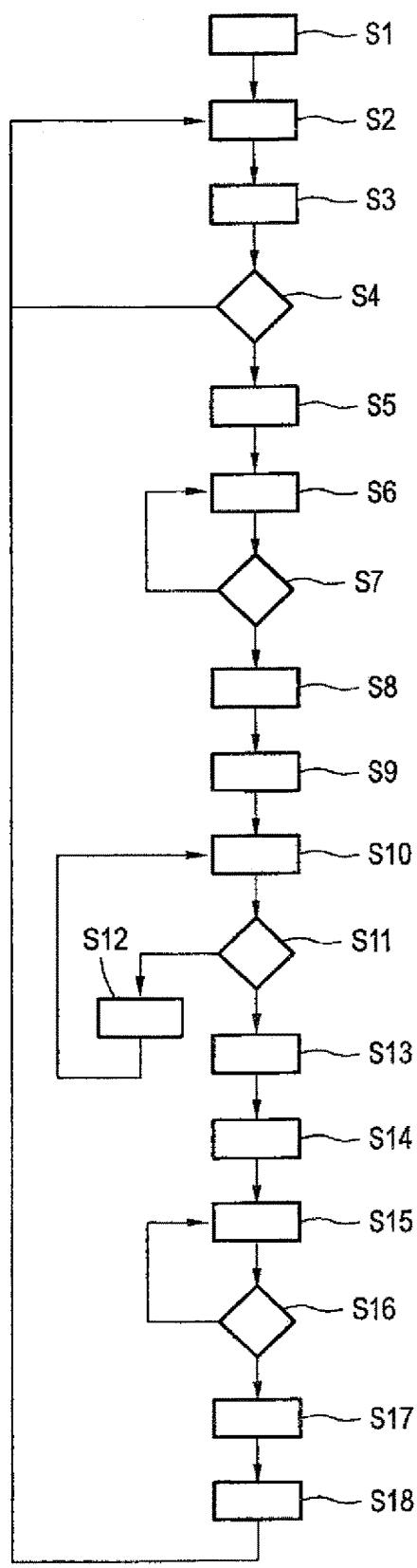

FIG. 3 shows a flow chart of a method for cooling a component of a motor vehicle, which is thermally coupled with a cooling volume that is filled with a liquid coolant. In step S1 first a user input on an input device of the motor vehicle is detected, which selects a vehicle mode. Step S1 is optional, wherein when the vehicle mode is not selected the vehicle remains in a previously selected mode. As an alternative a default vehicle mode can be provided for the vehicle. Depending on the vehicle mode multiple parameters that are used in the method are adjusted, in particular the first and the second threshold value for the cooling parameter and the maximal power value. In addition the cooling parameter may also be dependent on the drive mode. Step S1 is hereby repeatedly performed during the method in parallel to the further method steps and when detecting a user input which selects a different vehicle mode than the previous one the corresponding parameters are either adjusted immediately or at time points to be determined. For simplified representation of the method the detection of the user input is only shown in step S1 at the beginning of the method.

In step S2 the control device of the motor vehicle determines a set point power for the motor vehicle. For this purpose the position of the operating element 21, i.e., the gas pedal, in the motor vehicle shown in FIG. 2 is analyzed. Depending on the motor vehicle in which the method is performed and on the operating condition of the motor vehicle the set point power may depend on a plurality of further parameters, and may for example be predetermined by a driver assist system.

In the shown method the cooling of the component is performed in the first cooling mode in which the cooling volume is connected via a first and a second coupling device with the cooling circuit, which includes at least one circulation device by which the coolant is circulated. In the first cooling mode a strong cooling of the component is achieved, which is why the available power is not limited. Therefore in step S3, after detecting the set point power in step S2, the motor can be directly controlled so as to generate the requested set point power.

In step S4 it is then tested whether the set point power detected in step S2 is smaller than a second threshold value. The second threshold value is hereby a threshold value for the power below which, for the current vehicle mode selected in step S1, a switch into the second cooling mode is provided. The second threshold value is hereby selected so that when the drive is operated with a set point power that is equal to the second threshold value a sufficient cooling for the component is ensured in the second cooling mode. The lower the second threshold value is selected the less often a switch into the second cooling mode occurs. A less frequent switching into the second cooling mode can be advantageous in order to prevent a frequent switching between the cooling modes. At the same time a relatively high second threshold value can lead to an overall energy saving in the motor vehicle. Therefore the second threshold value can be adjusted in dependence on the vehicle mode. When the set point power is not smaller than the second threshold value the cooling is performed in the first cooling mode and the method is repeated from step S2.

However, when the set point power is smaller than the second threshold value switching into the second cooling mode is initiated in step S5. In step S5 first the first coupling device is controlled so that it separates the cooling volume from the cooling circuit at the inflow side. Because the circulation device continues to be operated a negative pressure is generated in the cooling volume. This is explained in more detail with reference to FIG. 1.

In step S6 the pressure in the cooling volume is detected with a pressure-measuring device arranged in the cooling volume. In step S7 the pressure is then compared with a first pressure threshold value. So long as the pressure does not fall below the pressure threshold value the method is repeated from step S6.

Only when the pressure detected by the pressure measuring device falls below the first pressure threshold value the second coupling device is performed is controlled in step S8 for separating the cooling volume from the cooling circuit. At the end of step S8 the cooling volume is thus completely separated from the cooling circuit and the pressure in the cooling volume is smaller than the first pressure value.

Because the cooling volume is now separated from the cooling circuit the circulation device can be deactivated in step S9. As a result, the energy consumption in the motor vehicle can be significantly reduced, in particular in a cooling device, which is configured for cooling components with a great waste. After deactivation of the circulation device in step S9 the change into the second cooling mode is complete and in the following the component is cooled in the second cooling mode. Hereby the component is cooled by evaporation of coolant in the cooling volume. This is explained in more detail with reference to FIG. 1.

In Step S10 the set point power is detected again. Of course the detection of the set point power and a corresponding motor control also occurs during the previous and following method steps parallel to the shown method steps. For clarity of the method the detection of the set point power and the motor control is only shown at those points at which it is essential for the method for cooling a component.

Because the cooling of the component now occurs in the second cooling mode the heat amount that can be dissipated from the component is smaller than in the first cooling mode. When the component is subjected to strong loads while being cooled in the second mode the temperature of the component will rise rapidly, in particular in a component with low thermal inertia. Therefore in step S11 the set point power detected in step S10 is compared with a maximal power value. In order to more clearly illustrate the method the maximal value in the shown exemplary embodiment is selected so that it is equal to the first threshold value for the cooling parameter, i.e., the first threshold value for the set point power. As explained below, when the set point power value detected in step S10 exceeds the maximal power value this always leads to switching into the first cooling mode. As an alternative it is of course also possible to select the maximal power value and the first threshold value independent of each other in particular to make it possible that also in the second cooling mode the component can briefly be operated with a power at which no constant cooling of the component in the second cooling mode is possible.

When it is detected in step S11 that the set point power detected in step S10 is greater than the maximal power value and with also not greater than the first threshold value the drive is controlled in step S12 with the set point power value detected in step S10 and the method is continued from step S10.

When it is determined in step 11 that the set point power value is greater than the maximal power value, the motor is controlled with the maximal power value. Limiting the maximal set point power with which the drive of the motor vehicle is controlled ensures, as explained, that the component can continued to be cooled in the second cooling mode, i.e., that during the change into the first cooling mode performed in the following steps no overheating of the component can occur. The limitation of the set point power performed in step S13, which is requested from the drive of the motor vehicle, of course also occurs during the parallel detection of the set point power and the motor control performed in the further steps.

Subsequently in step S14 the change into the first cooling mode is initiated. In step 14 the control device first controls the first coupling device in order to connect the cooling volume with the cooling circuit on the inflow side. Due to the pressure difference between the cooling volume and the coolant in the cooling circuit additional coolant starts flowing into the cooling volume from the cooling circuit as explained with reference to FIG. 1.

In step S15 a pressure in the cooling volume is detected by the pressure-measuring device arranged in the cooling volume and in step 16 the pressure is compared with a second pressure threshold value. Steps S15 and S16 are repeated until the detected pressure exceeds the second pressure threshold value.

Subsequently in step S17 the second coupling device is controlled in order to connect the cooling volume with the cooling circuit on the outflow side. Due to the inertia of the coolant, which as explained before already flows into the coupling volume, also the flow of the cooling volume through the second coupling device is built up. With this after step S17 an initial flow in the cooling circuit is already established. In step S18 the circulation device is then activated in order to enhance or maintain this flow. After the activation of the circulation device in step S18 the first cooling mode is completely established and the method can be repeated from step S2.

The foregoing exclusively describes a control of the cooling of the component in dependence on the set point power with reference to FIG. 3. A person with skill in the art can however obviously further modify the method so that instead of the set point power value a different cooling parameter is analyzed or that a cooling parameter is detected in dependence on multiple parameters of the motor vehicle. In addition obviously as explained with reference to FIG. 1, the method can also be further modified so that different cooling parameters are analyzed, wherein for each cooling parameter separate switching conditions for switching from the first cooling mode into the second cooling mode or from the second into the first cooling mode are present and a switching into one of the directions can already occur when only one of these conditions is satisfied or the like.

The invention claimed is:

1. A method for cooling a component of a motor vehicle, which is thermally coupled with a cooling volume filled with a coolant, said method comprising:
   detecting by a control device at least one cooling parameter; and
   as a function of the cooling parameter cooling the component in one of two cooling modes,
   a first cooling mode in which the cooling volume is connected with a cooling circuit via a first and a second coupling device, said cooling circuit having at least one circulation device by which the coolant is circulated,
   a second cooling mode in which the cooling volume is separated from the cooling circuit by the first and second coupling device, wherein the component is cooled by evaporation of the coolant in the cooling volume, and
   when changing from the first into the second cooling mode the pressure in the cooling volume is reduced,
   said first coupling device being arranged upstream of the cooling volume in relation to a direction of flow of the coolant in the first cooling mode, said second coupling device being arranged downstream of the cooling volume in relation to the direction of flow of the coolant in the first cooling mode,
   wherein when changing from the first into the second cooling mode first the first coupling device is separated, wherein after the separation of the first coupling device and only after a predetermined time period and/or when satisfying a predetermined separation condition, the second coupling device is separated.

2. The method of claim 1, wherein the component is an electric component, wherein the cooling parameter is one of an actual electrical operating parameter of the component or of a circuit which includes the component, and a set point value for the operating parameter set by the control device.

3. The method of claim 1, wherein the operating parameter is a current strength of a current flowing through the component or a predetermined part of the circuit or a voltage dropping at the component or between two predetermined points of the circuit or an electrical power taken up or given off by the circuit is detected.

4. The method of claim 1, wherein the cooling parameter is continuously detected and when the cooling parameter exceeds a first predetermined threshold value and falling below the first or a second predetermined threshold value the control device changes the cooling mode.

5. The method according to claim 4, wherein the separation condition is satisfied when the pressure in the cooling volume falls below a predetermined first pressure value in the cooling volume.

6. The method of claim 1, wherein when switching from the second cooling mode into the first cooling mode connecting the first coupling device, and only after a predetermined time period after connecting the first coupling device and/or when a predetermined connection condition is satisfied, connecting the second coupling device.

7. The method of claim 6, wherein the connection condition is satisfied when a pressure in the cooling volume exceeds of a predetermined second pressure value.

8. The method of claim 1, further comprising expanding or reducing the cooling volume against a predetermined force with a volume compensation device connected with the cooling volume.

9. The method of claim 1, wherein in the first cooling mode the coolant is conducted turbulently through the cooling volume.

10. A cooling device for cooling a component of a motor vehicle, said cooling device, comprising:
   a cooling volume thermally coupled with the component and filled with a coolant;
   a cooling circuit having at least one circulation device for circulation of the coolant;
   a first and a second coupling device, operable to connect the cooling volume to the cooling circuit; and
   a control device configured to detect at least one cooling parameter and, by controlling the first and second coupling device as a function of the at least one cooling parameter, to switch the cooling device between a first cooling mode in which the cooling volume is connected with the cooling circuit via the first and second coupling device, and a second cooling mode in which the cooling volume is separated from the cooling circuit, wherein in the second cooling mode the component is cooled by evaporation of the coolant in the cooling volume, said first coupling device being arranged upstream of the cooling volume in relation to a direction of flow of the coolant in the first cooling mode, said second coupling device being arranged downstream of the cooling volume in relation to the direction of flow of the coolant in the first cooling mode, wherein a pressure in the cooling volume is reduced during a change from the first into the second cooling mode, said control device being configured during the change from the first into the second cooling mode to first separate the first coupling device form the cooling volume, and thereafter to separate the second coupling device from the cooling volume only after a predetermined time period after separating the first coupling device and/or when a predetermined separation condition is satisfied.

11. The cooling device of claim 10, wherein the cooling circuit includes a compensation container for the coolant.

12. The cooling device of claim 10, further comprising at least one pressure-measuring device arranged in the cooling volume and/or in the cooling circuit for detecting the coolant pressure.

13. A motor vehicle, comprising:
a cooling device, said cooling device, comprising
a cooling volume thermally coupled with the component and filled with a coolant;
a cooling circuit having at least one circulation device for circulation of the coolant;
a first and a second coupling device, operable to connect the cooling volume to the cooling circuit; and
a control device configured to detect at least one cooling parameter and, by controlling the first and second coupling device as a function of the at least one cooling parameter, to switch the cooling device between a first cooling mode in which the cooling volume is connected with the cooling circuit via the first and second coupling device, and a second cooling mode in which the cooling volume is separated from the cooling circuit, wherein in the second cooling mode the component is cooled by evaporation of the coolant in the cooling volume, said first coupling device being arranged upstream of the cooling volume in relation to a direction of flow of the coolant in the first cooling mode, said second coupling device being arranged downstream of the cooling volume in relation to the direction of flow of the coolant in the first cooling mode, wherein a pressure in the cooling volume is reduced during a change from the first into the second cooling mode, said control device being configured during the change from the first into the second cooling mode to first separate the first coupling device form the cooling volume, and thereafter to separate the second coupling device from the cooling volume only after a predetermined time period after separating the first coupling device and/or when a predetermined separation condition is satisfied.

14. The motor vehicle of claim 13, wherein the component is a power electronics component of an electric drive of the motor vehicle.

15. The motor vehicle of claim 14, wherein the control device is configured for limiting a power of the drive to a maximal power value when the cooling device operates in the second cooling mode, said maximal power being smaller than a power value with which the drive can be driven in the first cooling mode.

16. The motor vehicle of claim 15, further comprising a vehicle device configured to predetermine a set point power and operable by a driver or a driver assist system, wherein the control device is configured to detect the set point power predetermined by the vehicle device, and when detecting a set point power which is greater than the maximal power value to switch into the second cooling mode.

17. The motor vehicle of claim 16, wherein the vehicle device is an operating element.

18. The motor vehicle of claim 10, further comprising an input device for detecting a user input for selecting a vehicle mode and a control device, said control device being configured for determining at least one of the cooling parameter, the first threshold value for the cooling parameter, the second threshold value for the cooling parameter and the maximal power value in dependence on the vehicle mode.

* * * * *

UNITED STATES PATENT AND TRADEMARK OFFICE
CERTIFICATE OF CORRECTION

PATENT NO. : 10,195,958 B2
APPLICATION NO. : 15/118381
DATED : February 5, 2019
INVENTOR(S) : Karl-Heinz Meitinger Page 1 of 1

It is certified that error appears in the above-identified patent and that said Letters Patent is hereby corrected as shown below:

In the Claims

In Column 17, Claim 10, Line 21: replace "device form" with --device from--.
In Column 18, Claim 13, Line 16: replace "device form" with --device from--.

Signed and Sealed this
Eighteenth Day of June, 2019

Andrei Iancu
*Director of the United States Patent and Trademark Office*